United States Patent [19]

Priestley et al.

[11] 4,282,268
[45] Aug. 4, 1981

[54] METHOD OF DEPOSITING A SILICON OXIDE DIELECTRIC LAYER

[75] Inventors: Eldon B. Priestley, East Windsor; Patrick J. Call, Princeton, both of N.J.

[73] Assignee: RCA Corporation, New York, N.Y.

[21] Appl. No.: 913,241

[22] Filed: Jun. 6, 1978

Related U.S. Application Data

[63] Continuation of Ser. No. 793,641, May 4, 1977, abandoned.

[51] Int. Cl.³ .............................................. B05D 3/06
[52] U.S. Cl. ...................................... 427/39; 427/40; 427/124; 427/295; 427/296
[58] Field of Search .................... 427/39, 41, 40, 124, 427/295, 296

[56] References Cited

U.S. PATENT DOCUMENTS

| | | | |
|---|---|---|---|
| 3,158,505 | 11/1964 | Sandor | 427/39 |
| 3,243,363 | 3/1966 | Helwig | 427/39 |
| 3,473,959 | 10/1969 | Ehinger et al. | 427/39 |
| 3,833,408 | 9/1974 | Matthies | 252/49.6 |

FOREIGN PATENT DOCUMENTS 46-534 8/1971 Japan ......................................... 427/39

OTHER PUBLICATIONS

Klerer, pp. 1070-1071, Nov. 1961, "A Method ... Low Temp."
Powell, et al., "Vapor Deposition", Aug. 1, 1966, pp. 604-606.

*Primary Examiner*—Bernard D. Pianalto
*Attorney, Agent, or Firm*—H. Christoffersen; Birgit E. Morris; Allen Bloom

[57] ABSTRACT

This invention pertains to a method of depositing a silicon oxide, such as silicon dioxide, dielectric layer on a substrate by utilizing a glow discharge and a dielectric precursor having the formula $$\begin{array}{c} R_1 \\ | \\ R_4-Si-R_2 \\ | \\ R_3 \end{array}$$

wherein $R_1$ is selected from the group consisting of H and $-CH_3$, $R_2$ and $R_3$ are independently selected from the group consisting of H, $-CH_3$, $-OCH_3$ and $-OC_2H_5$ and $R_4$ is selected from the group consisting of $-OCH_3$ and $-OC_2H_5$.

8 Claims, 1 Drawing Figure

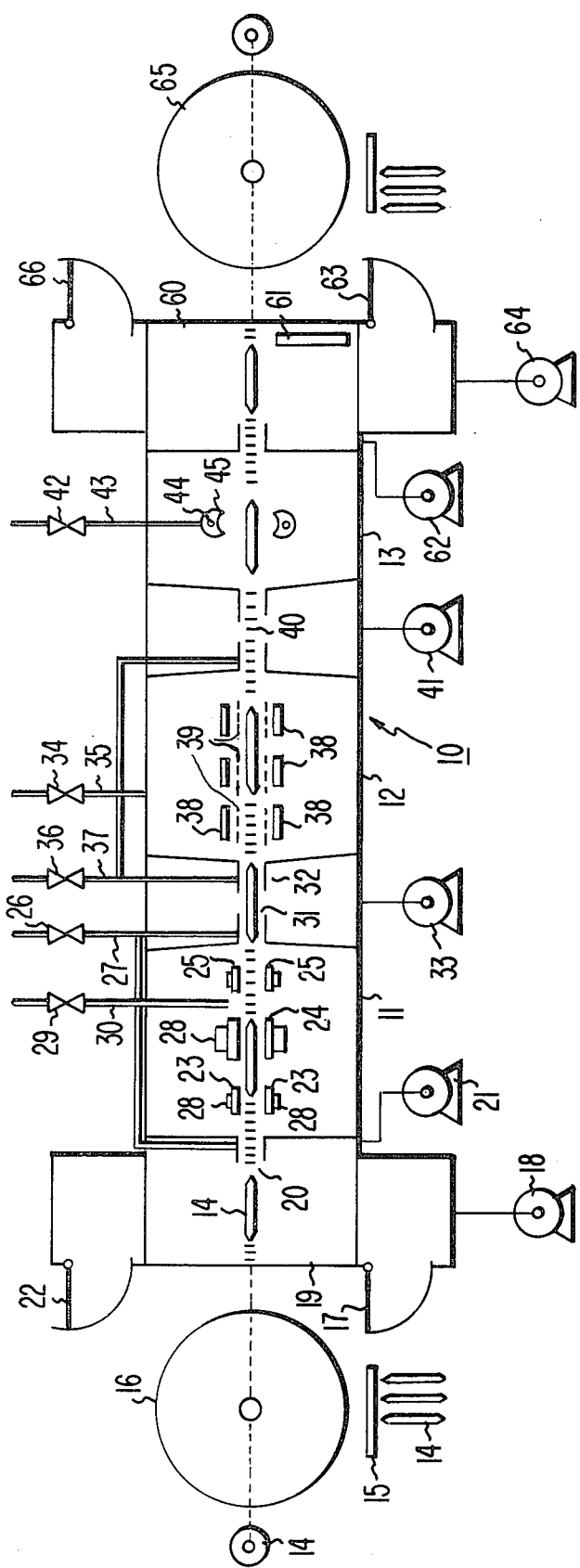

METHOD OF DEPOSITING A SILICON OXIDE DIELECTRIC LAYER

This is a continuation of application Ser. No. 793,641, filed May 4, 1977, now abandoned.

REFERENCE TO RELATED APPLICATIONS

This application is related to copending application "A Video Disc with a Dielectric Layer formed from Styrene and Nitrogen" by G. Kaganowicz and J. W. Robinson, now U.S. Pat. No. 4,072,985; copending application "Method of Depositing a Lubricant Layer on a Video Disc" by A. D. Grubb and G. F. Nichols, Ser. No. 793,643, now abandoned; copending application "A Video Disc Capacitive Recording Means with a Conductive Bilayer", by J. L. Vossen, now U.S. Pat. No. 4,077,052; and copending application "A Video Disc with a Conductive Layer Having an Oxygen Content Gradient" to J. L. Vossen, now U.S. Pat. No. 4,077,051, which applications are filed concurrently with the parent application and are herein incorporated by reference.

BACKGROUND OF THE INVENTION

An audio/video information system for recording and playing back audio/video information has been described in U.S. Pat. Nos. 3,842,194 and 3,842,217 to Clemens. According to this system, audio and video information are recorded in the form of geometric variations in spiral grooves on the surface of a disc. Disc replicas are then made of an insulating material such as vinyl and are coated first with a conductive film, then with a dielectric film and finally with a lubricant layer. A metallized stylus is utilized as a second electrode forming a capacitor with the video disc. The audio/video information is monitored by the stylus which detects changes in capacitance between the stylus and the video disc as the geometric variations in the form of depressions pass under the stylus.

The conductive layers are deposited such as described in U.S. Pat. No. 3,982,066 to Nyman et al, herein incorporated by reference; the dielectric layers are deposited such as described in U.S. Pat. No. 3,843,399 to Kaplan et al and U.S. Pat. No. 3,901,994 to Mehalso et al which patents are herein incorporated by reference; and the lubricant layers are deposited such as described in U.S. Pat. No. 3,833,408 to Matthies which is herein incorporated by reference.

The dielectric layers employed in the above mentioned patents are organic layers such as poly-p-xylene and organic layers formed from the deposition of styrene in a glow discharge. The major disadvantages with these organic layers are chemical and physical instability, difficulty in characterization, poor adhesion to the conductive layers and lack of interdisc and intradisc uniformity. Furthermore, the chemical and physical instability contributes to lubrication failure which results in premature wear of the disc surface and in increased wear of the stylus.

To avoid the problems associated with organic dielectric layers, attempts have been made to utilize inorganic dielectric layers such as silicon oxides. Layers of silicon oxide such as silicon dioxide can be deposited in a glow discharge by one of the following reaction mechanisms.

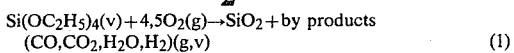

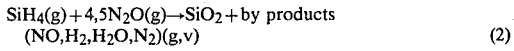

These deposition methods have been widely reported in the art by such authors as S. P. Mukherjee and P. E. Evans, *Thin Solid Films*, Vol. 14, 105 (1972); D. R. Secrist and J. D. MacKenzie, *J. Electrochem Soc.*, Vol. 113, 914 (1966); R. J. Joyce, H. F. Sterling and J. H. Alexander, *Thin Solid Films*, Vol. 1, 481 (1967/68); D. M. Brown, P. V. Gray, K. F. Hauman, H. R. Phillipp and E. A. Taft, *J. Electrochem Soc., Solid State Science*, Vol. 115, 311 (1968); D. R. Secrist and J. D. MacKenzie, *Solid State Electronics*, Vol. 9, 180 (1966); and S. W. Ing, Jr. and W. Davern *J. Electrochem Soc.*, Vol. 112, 284 (1965).

These reaction methods, however, have disadvantages when employed for depositing silicon dioxide dielectric layers on video discs. The reaction of equation (1) produces a large quantity of gaseous by-products which limit the rate at which silicon dioxide dielectric layers may be deposited. The reaction of equation (2) allows for higher deposition rates, but this method has been found to produce a silicon dioxide layer which causes excessive wear of the stylus.

SUMMARY OF THE INVENTION

It has been found that a silicon oxide dielectric layer can be deposited on a substrate by evacuating a chamber and introducing into said chamber the substrate, oxygen and a dielectric precursor which has the formula

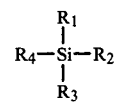

wherein $R_1$ is selected from the group consisting of H or —$CH_3$, $R_2$ and $R_3$ are independently selected from the group consisting of H, —$CH_3$, —$OCH_3$, or —$OC_2H_5$ and $R_4$ is selected from the group consisting of —$OCH_3$ or —$OC_2H_5$. The silicon oxide dielectric layer is deposited onto the conductive surface by activating the precursor around the substrate by means of a glow discharge. Silicon oxide dielectric layers have been deposited in this manner at high rates and the deposited silicon oxide layers have been found not to cause excess wear of either the disc or stylus upon playback.

BRIEF DESCRIPTION OF THE DRAWING

The FIGURE is a schematic illustration of an apparatus for vacuum depositing first a conductive layer, then a dielectric layer, and finally a lubricant layer on a vinyl disc containing geometrically coded audio/video information.

DETAILED DESCRIPTION OF THE INVENTION

The substrate on which the silicon oxide dielectric layer is deposited may be selected from numerous materials such as metals, alloys, plastics, inorganics, and glass. In an embodiment of this invention the substrate is a conductive material forming a geometrically conformal layer on a vinyl disc surface containing geometrically coded audio/video information. The disc replica is stamped from a suitable material such as vinyl and coated with the conductive layer in accordance with the manner described in the above-mentioned Clemens and Nyman et al patents.

Next, a layer of a silicon oxide, such as silicon dioxide, is deposited by means of a glow discharge in a vacuum chamber. The silicon oxide layer may be applied using a batch process wherein the discs are introduced into a chamber which is then evacuated and the silicon oxide layer deposited or the silicon oxide layer may be applied utilizing a continuous process wherein discs in a continuous manner are introduced into an evacuated chamber, coated and removed. When a continuous process is used, adjacent interconnecting vacuum chambers may be employed for depositing the prior conductive layer and a subsequent lubricant layer.

According to the present invention; also introduced into the silicon oxide deposition chamber is oxygen and a dielectric precursor of the formula

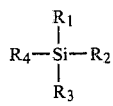

wherein $R_1$ is selected from the group consisting of H and $-CH_3$, $R_2$ and $R_3$ are independently selected from the group consisting of H, $-CH_3$, $-OCH_3$ and $-OC_2H_5$ and $R_4$ is selected from the group consisting of $-OCH_3$ and $-OC_2H_5$. The oxygen and dielectric precursor must be introduced in sufficient quantities to form dielectric layers from about 50 to 250 angstroms thick at commercially acceptable rates. The total amount of gas in the chamber, however, should not be great enough to cause the vacuum to exceed about 12 microns when adjacent vacuum chambers are employed to deposit metal layers and lubricant layers, since contamination of these chambers will occur. It has also been found that the ratio of the partial pressure of oxygen to the partial pressure of the precursor in the chamber affects the properties of the deposited dielectric films. Ratios of oxygen to precursor below about 1:1 yield oxygen-deficient films. Ratios of about 4:1 produce films with optimum stability and corrosion resistance; however, ratios above about 10:1 increase operating pressures unnecessarily.

After the dielectric layer has been deposited, a lubricant layer is deposited in accordance with the manner described in the above mentioned copending application to Grubb et al utilizing the silicone lubricants described in U.S. Pat. No. 3,833,408 to Matthies. Since the metal layers, dielectric layers, and lubricant layers can be deposited under vacuum conditions in a continuous manner, a single vacuum chamber may be employed for depositing all the layers, permitting rapid processing of the video discs.

BRIEF AND DETAILED DESCRIPTION OF THE FIGURE

The FIGURE is a cross-sectional top view which schematically illustrates a single apparatus for depositing the above described layers in a continuous manner. A vacuum chamber 10 is divided into three connecting evacuated chambers; a metal deposition chamber 11, a dielectric deposition chamber 12, and a lubricant deposition chamber 13. Vinyl disc replicas 14 containing geometrically coded audio/video information are first assembled onto racks 15 by a disc assembler 16. The disc replicas 14 are then transported into the vacuum chamber 10 via an inlet pressure lock 17. As the vinyl discs 14 proceed through the inlet pressure lock 17, the pressure is reduced by means of a pump 18 to about 10 to 50 microns. This approximately equalizes the pressure in the inlet pressure lock 17 with the evacuated chamber 10 which is maintained at about 3 to 12 microns during operation. The vinyl discs 14 are then transported into a loading area 19 where the vinyl discs 14 are taken from the racks 15 and loaded singly in a vertical position onto a continuously moving conveyor belt 20 which advances about 0.2 feet (6 cm) per second. The vacuum in the loading area 19 is maintained by a pump 21. The racks 15 are removed from the loading area 19 by way of an exit pressure lock 22 after pressure in the lock 22 has been equalized with atmospheric pressure.

The vinyl discs 14 which have been loaded onto the conveyor belt 20 are conveyed into the metal deposition chamber 11 where metal layers are sputtered onto both sides of the vinyl discs 14. Suitably, the coated metal layers consist of either a bilayer consisting of a copper layer and a nickel/chromium/iron alloy layer, or a trilayer consisting of a copper layer, a nickel/chromium/iron alloy layer and a copper layer. When a bilayer is to be deposited, the vinyl discs 14 first pass between a pair of copper cathodes 23 which are about 4 inches (10 cm)×14 inches (35.6 cm) in size and about 4 inches (10 cm) apart and then pass between a pair of nickel/chromium/iron alloy cathodes 24 which are about 14 inches (35.6 cm)×29 inches (74 cm) in size and about 10 inches (25.4 cm) apart. When a trilayer is to be deposited, the vinyl discs 14 will further pass between another pair of copper cathodes 25 as described above. It has been found that a silicon oxide layer will bond more strongly to the nickel/chromium/iron alloy layer of the bilayer than to a copper layer of the trilayer.

In order to sputter the metal from the cathodes onto the vinyl discs 14, about 220 standard cubic centimeters per minute (sccm) of argon gas is introduced through a valve 26 and a line 27. About 130 sccm of argon gas is introduced at the inlet of the chamber 11 and about 90 sccm is introduced at the chamber exit. The pressure in the metal deposition chamber 11 is maintained at about 4 to about 8 microns. A glow discharge in the argon gas is created by supplying a current to the cathodes. Ions from the glow discharge which are confined by means of planar magnetrons 28, strike the metal cathodes ejecting metal atoms.

The metal atoms collect on the vinyl discs 14 forming metal layers. The copper layers are approximately 25 to 50 angstroms thick and the nickel/chromium/iron alloy layers are about 100 to 400 angstroms thick. In order to produce stable, stress-free films of the nickel/chromium/iron alloy, oxygen is added through a valve 29 and a line 30 so as to produce an alloy film containing 5 to 20 atomic percent of oxygen as determined by Auger depth profile analysis. By introducing the oxygen at a point where the vinyl discs 14 move away from the alloy cathodes 24 as shown in the FIGURE, peak oxygen values of 10 to 35 atomic percent in the alloy layer will occur at the surface which will contact the silicon oxide dielectric layer if a conductive bilayer is employed. This allows for a low average oxygen content in the alloy since only small amounts of oxygen can be present at the interface with the first copper layer. Low average oxygen contents result in greater conductivity of the alloy layer.

The vinyl discs 14 are then conveyed through a 2 inch (5 cm) wide tunnel 31 formed from metal sheets 32 into the dielectric deposition chamber 12. A low pressure is maintained in the tunnel 31 by means of a vacuum pump 33 to minimize cross-contamination of the gases in the metal deposition chamber 11 with the gases in the dielectric deposition chamber 12.

The dielectric layer is deposited by glow discharge according to the present invention. The dielectric precursor is added through a valve 34 and a line 35 and oxygen is supplied through a valve 36 and a line 37. A glow discharge is created by supplying an electrical current to pairs of screen electrodes 39 and the discharge is confined by magnets 38. From one to three pairs of electrodes may be employed, depending upon the desired rate of deposition and the desired layer thickness. The glow discharge activates the dielectric precursor which results in silicon oxide depositing on the surface of the discs 14. Radio frequency current is supplied to each electrode to produce power densities from about 0.3 to 1.2 watts per cm$^2$. The current can be varied to regulate the thickness of the deposited film and the heat buildup on the disc which should not exceed about 130° F. (54° C.). The density of the screen electrodes 39 (open area/total area) determines the amount of energy available to the dielectric precursor surrounding the vinyl discs 14, which also affects the deposition rate of the silicon oxide dielectric layer. Suitable screen densities are from 0% to about 30%.

After the vinyl discs are coated with a silicon oxide dielectric layer, they are conveyed into the lubricant deposition chamber 13 through a second tunnel 40. The tunnel 40 is maintained at a low pressure by means of a vacuum pump 41 to prevent cross-contamination of the gases from the dielectric deposition chamber 12 with gases of the lubricant deposition chamber 13. The liquid lubricant to be deposited is added through a valve 42 and a line 43. The oil is vaporized in an oil vaporizer 44 by contacting the oil with a hot surface at about 235° C. As the oil vaporizes, it diffuses from the hot surface and is directed towards the discs 14 by means of a perforated vapor distributor 45. As the oil vapor contacts the discs 14, it condenses on the discs' surfaces forming a thin uniform lubricant layer. The rate of oil vaporization, the geometry of the vapor distributor 45, the pressure in the chamber 13, and the rate at which the discs 14 pass through the vapor distributor 45 control the thickness of the lubricant layer. Suitable lubricant layer thicknesses are from about 90 to 400 angstroms and preferably 180 to 230 angstroms.

The discs 14, now containing a metal layer, a dielectric layer and a lubricant oil layer, are conveyed into a disc collection area 60 where they are removed from the conveyor 20 and assembled onto racks 61. A vacuum in the disc collection area 60 is maintained by means of a pump 62. The racks 61 and the vinyl discs 14 then are transported through an outlet pressure lock 63 which has been evacuated by means of pump 64. The discs 14 and the rack 61 are removed from the vacuum chamber 10 after the outlet pressure lock 63 is brought to atmospheric pressure. A disc assembler 65 removes the vinyl discs 14 from the racks 61 and the racks 61 are returned to the vacuum chamber 10 by way of an inlet pressure lock 66.

The following Examples are presented to further describe the invention but it is not meant to limit the invention to the details described therein.

EXAMPLE 1

In this Example vinyl disc replicas, each approximately 30.5 cm in diameter and containing geometrically coded audio/video information in a spiral groove, were coated with conductive layers, dielectric layers, and lubricant layers utilizing an apparatus as described in the FIGURE. The vinyl discs were coated at the rate of 720/hour.

The deposited conductive layer was a bilayer consisting of a first copper layer about 50 angstroms thick and then an alloy layer of Inconel (76.8% Ni, 13.8% Cr. and 8.5% Fe) about 200 angstroms thick. The metal deposition chamber was maintained at 6 microns pressure, the copper cathodes were activated with 450 volts and 1.4 amperes of current and the magnetrons maintained a field of 330 gauss. The Inconel electrode was activated with 540 volts and 17.5 amperes of current.

Into the dielectric deposition chamber was introduced oxygen and methyl dimethoxysilane (SiH(OCH$_3$)$_2$CH$_3$), a dielectric precursor. The dielectric chamber was maintained at 10 microns pressure with the ratio of the partial pressure of the oxygen to the dielectric precursor maintained at 4/1. The screen electrodes were maintained at a power density of 1 watt/cm$^2$ at 10 kilohertz and the screen density was 30%. The deposited silicon oxide layer was about 150 angstroms thick.

In the lubricant chamber a lubricant was added to the vaporizer at the rate of 6 ml/hour. The lubricant was a silicon compound having a viscosity of about 49.0 centistokes at 25° C. and a specific gravity of 0.89 and having the formula

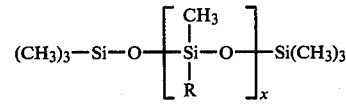

wherein R is an alkyl group of about 4–20 carbon atoms and x is an integer. The vaporizer surface was maintained at a temperature of about 235° C. and the lubricant chamber was maintained at 5 microns pressure. The deposited lubricant layer was 180 angstroms thick.

The coated video discs were then repeatedly played back by contacting the rotating discs with a stylus as described in Clemens. After 1000 playbacks there was not found excessive wear of either the stylus or the disc surface and the disc surface continued to maintain fidelity with the geometrically coded audio/video information in the disc.

EXAMPLES 2–4

In these Examples the procedure of Example 1 was substantially followed except that the dielectric chamber pressure, the partial pressure ratio of the oxygen to precursor, the screen electrode power density and the screen density were varied. The results and operational details are recorded in the Table.

CONTROL A

This Example is presented as a control. The procedure of Example 1 was substantially followed except that tetraethoxysilane (Si(OC$_2$H$_5$)$_4$) was employed as the dielectric precursor rather than methyl dimethoxysilane. It was found that the by-products generated by the tetraethoxysilane increased the pressure in the dielectric chamber beyond acceptable limits which necessitated lowering the introduction rate of tetraethoxysilane and hence, lowering the thickness of the $SiO_2$ layer formed in the chamber to about 25 angstroms, which is inadequate to form an effective dielectric layer.

CONTROL B

This Example is also presented as a control. The procedure of Example 1 was substantially followed except silane was employed as the dielectric precursor instead of methyldimethoxysilane. It was found that after only one playback, styli were excessively worn.

TABLE

| Ex. | Chamber Pressure (microns) | Partial Pressure Ratio of Oxygen to Precursor | Power Density (watts/cm$^2$) | Screen Density (%) | Silicon Oxide Thickness (angstroms) |
|---|---|---|---|---|---|
| 2 | 8.1 | 4.4 | 1.0 | 30 | 50 |
| 3 | 10.8 | 2.2 | 1.0 | 30 | 110 |
| 4 | 9.2 | 1.8 | 1.2 | 0 | 85 |

What is claimed is:

1. In a method for preparing a video disc comprising a substrate containing video information in the form of a surface relief pattern having a conductive layer thereon and dielectric layer thereover wherein the said dielectric layer is deposited by the steps comprising introducing the substrate into an evacuated chamber, introducing oxygen and a dielectric precursor into the chamber and activating the pecursor around the substrate by means of a glow discharge whereby a dielectric coating is deposited on the disc, wherein the improvement comprises preparing a silicon oxide dielectric layer wherein the dielectric precursor has the formula

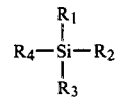

wherein $R_1$ is selected from the group consisting of H and $-CH_3$, $R_2$ and $R_3$ are independently selected from the group consisting of H, $-CH_3$, $-OCH_3$ and $-OC_2H_5$ and $R_4$ is selected from the group consisting of $-OCH_3$ and $-OC_2H_5$ whereby a silicon oxide dielectric layer is deposited.

2. A method according to claim 1 wherein the silicon oxide is silicon dioxide.

3. A method according to claim 1 wherein the chamber pressure is below 12 microns.

4. A method according to claim 1 wherein the ratio of the partial pressure of the oxygen to the partial pressure of the precursor in the chamber is from 1:1 to 10:1.

5. A method according to claim 1 wherein the ratio of the partial pressure of the oxygen to the partial pressure of the precursor in the chamber is about 4:1.

6. A method according to claim 1 wherein the dielectric precursor is methyl dimethoxysilane.

7. A method according to claim 1 wherein the deposited silicon oxide film is from about 50 to about 250 angstroms thick.

8. A method according to claim 1 wherein the deposited silicon oxide film is about 150 angstroms thick.

* * * * *